United States Patent
Su et al.

[11] Patent Number: 5,869,406
[45] Date of Patent: Feb. 9, 1999

[54] METHOD FOR FORMING INSULATING LAYERS BETWEEN POLYSILICON LAYERS

[75] Inventors: Wen-Doe Su, Chu-Tung; Chia-Lin Ku, Chu-Pei, both of China

[73] Assignee: Mosel Vitelic, Inc., China

[21] Appl. No.: 534,901

[22] Filed: Sep. 28, 1995

[51] Int. Cl.⁶ .......................... H01L 21/31; H01L 21/316
[52] U.S. Cl. ........................ 438/789; 438/790; 438/909
[58] Field of Search ...................... 437/235, 238, 437/949, 247; 438/789, 790, 787, 788, 909

[56] References Cited

U.S. PATENT DOCUMENTS

| | | |
|---|---|---|
| 3,614,548 | 10/1971 | Inoue . |
| 4,675,715 | 6/1987 | Lepselter et al. . |
| 4,845,054 | 7/1989 | Mitchener . |
| 4,900,591 | 2/1990 | Bennett et al. . |
| 4,916,091 | 4/1990 | Freeman et al. . |
| 5,010,032 | 4/1991 | Tang et al. . |
| 5,063,655 | 11/1991 | Lamey et al. . |
| 5,166,767 | 11/1992 | Kapoor et al. . |
| 5,192,703 | 3/1993 | Lee et al. . |
| 5,238,872 | 8/1993 | Thalapaneni . |
| 5,290,736 | 3/1994 | Sato et al. ................................ 437/238 |
| 5,304,398 | 4/1994 | Krusell et al. . |
| 5,413,967 | 5/1995 | Matsuda et al. . |
| 5,422,290 | 6/1995 | Grubisch . |
| 5,459,108 | 10/1995 | Doi et al. . |
| 5,460,983 | 10/1995 | Hodges et al. . |
| 5,482,871 | 1/1996 | Pollack . |
| 5,521,126 | 5/1996 | Okamura et al. . |
| 5,525,551 | 6/1996 | Ohta . |

Primary Examiner—Olik Chaudhuri
Assistant Examiner—Kevin F. Turner
Attorney, Agent, or Firm—Townsend and Townsend and Crew LLP

[57] ABSTRACT

A method of fabricating an integrated circuit device with a substantially uniform inter-layer dielectric layer. The method includes steps of providing a partially completed semiconductor wafer (400) where the partially completed semiconductor device has a first polysilicon layer (401) thereon. The method includes depositing a dielectric layer (405) overlying the polysilicon layer and portions of the partially completed semiconductor device at a pressure of about 1 atmosphere. A step of forming a second polysilicon layer overlying portions of the dielectric layer is also included. The dielectric layer depositing step includes combining an organic silane and an ozone at a concentration of 200 g/m³ and less.

25 Claims, 4 Drawing Sheets

CROSS SECTIONAL SEM OF CELL ARRAY

METHOD FOR FORMING INSULATING LAYERS BETWEEN POLYSILICON LAYERS

BACKGROUND OF INVENTION

The present invention relates to semiconductor integrated circuits and their manufacture. More particularly, the invention relates to a technique for forming an insulating layer between a lower conductive layer and an upper conductive layer in a dynamic random access memory (DRAM) device. But it will be recognized that the invention has a wider range of applicability. Merely by way of example, the invention may be applied in the manufacture of other semiconductor devices and conductive layers made of materials such as polysilicon, aluminum, titanium, tungsten, silicide, and others.

Industry utilizes or has proposed techniques for fabrication of an insulating layer (or inter-layer dielectric) between conductive layers in a DRAM process. Fabrication steps generally include applying a first polysilicon layer (poly-1), depositing an insulating layer using low pressure chemical vapor deposition (LPCVD) overlying the first polysilicon layer, and then applying a second polysilicon layer (poly-2) overlying the insulating layer.

Despite recent advances in deposition techniques, insulating layer thickness is still difficult to control, especially for devices have smaller line widths such as those with sub-micron features. For example, an insulating layer that is too thick often causes alignment and etching problems in subsequent steps. Alternatively, an insulating layer that is too thin often creates isolation problems (e.g., short circuit) between the first and the second polysilicon layers.

Other limitations with the conventional insulating layer can include a high water-absorbability, a high etching rate, and a high shrinkage rate. These limitations often occur by way of insulating layers fabricated using an LPCVD technique. High water-absorbability promotes uncontrollable etching, that is, etching that produces a non-uniform layer. High shrinkage rate causes undesired stress on surfaces of the device which affects device performance and reliability.

A further limitation with the conventional insulating layer deposited by LPCVD is stringers in certain areas of the cell structure, which is due predominantly to the fully conformal characteristic of the LPCVD film. That is, the fully conformal film creates an upper surface profile characterized by gaps and voids thereon. The stringers are formed in these gaps and voids.

From the above it is seen that a method of fabricating an inter-layer dielectric that is easy, reliable, consistent, and cost effective is often desired.

SUMMARY OF THE INVENTION

According to the present invention, a method and resulting semiconductor device structure for an inter-layer dielectric is provided. The present method provides a relatively even and easy to fabricate inter-layer dielectric in a DRAM structure.

In a specific embodiment, the present invention provides a method of fabricating an integrated circuit device. The method includes providing a partially completed semiconductor device. The partially completed semiconductor device has a first polysilicon layer thereon. The method also includes depositing a dielectric layer overlying the polysilicon layer and portions of the partially completed semiconductor device at a pressure of about 1 atmosphere. A step of forming a second polysilicon layer overlying portions of the dielectric layer is also included. The dielectric layer depositing step combines an organic silane and an ozone where the ozone at a relatively low concentration.

In an alternative specific embodiment, the present invention provides a method of forming a dielectric layer. The method includes combining an organic silane and an ozone at a pressure of about 1 atm. The ozone is at a relatively low concentration. The method also includes forming an insulating layer from the ozone and the organic silane mixture.

A further alternative specific embodiment includes a method of forming an integrated circuit device. The method includes providing a partially completed device comprising a plurality of regions, where the plurality of regions comprises a first polysilicon region and a field isolation oxide region. The method also includes introducing a mixture, including an organic silane and an ozone at a pressure of about 1 atmosphere, where the ozone at a relatively low pressure. The method further includes forming a dielectric layer from the mixture overlying the plurality of regions.

The present invention achieves these benefits in the context of known process technology. However, a further understanding of the nature and advantages of the present invention may be realized by reference to the latter portions of the specification and attached drawings.

DETAILED DESCRIPTION OF THE INVENTION

Figure 1:
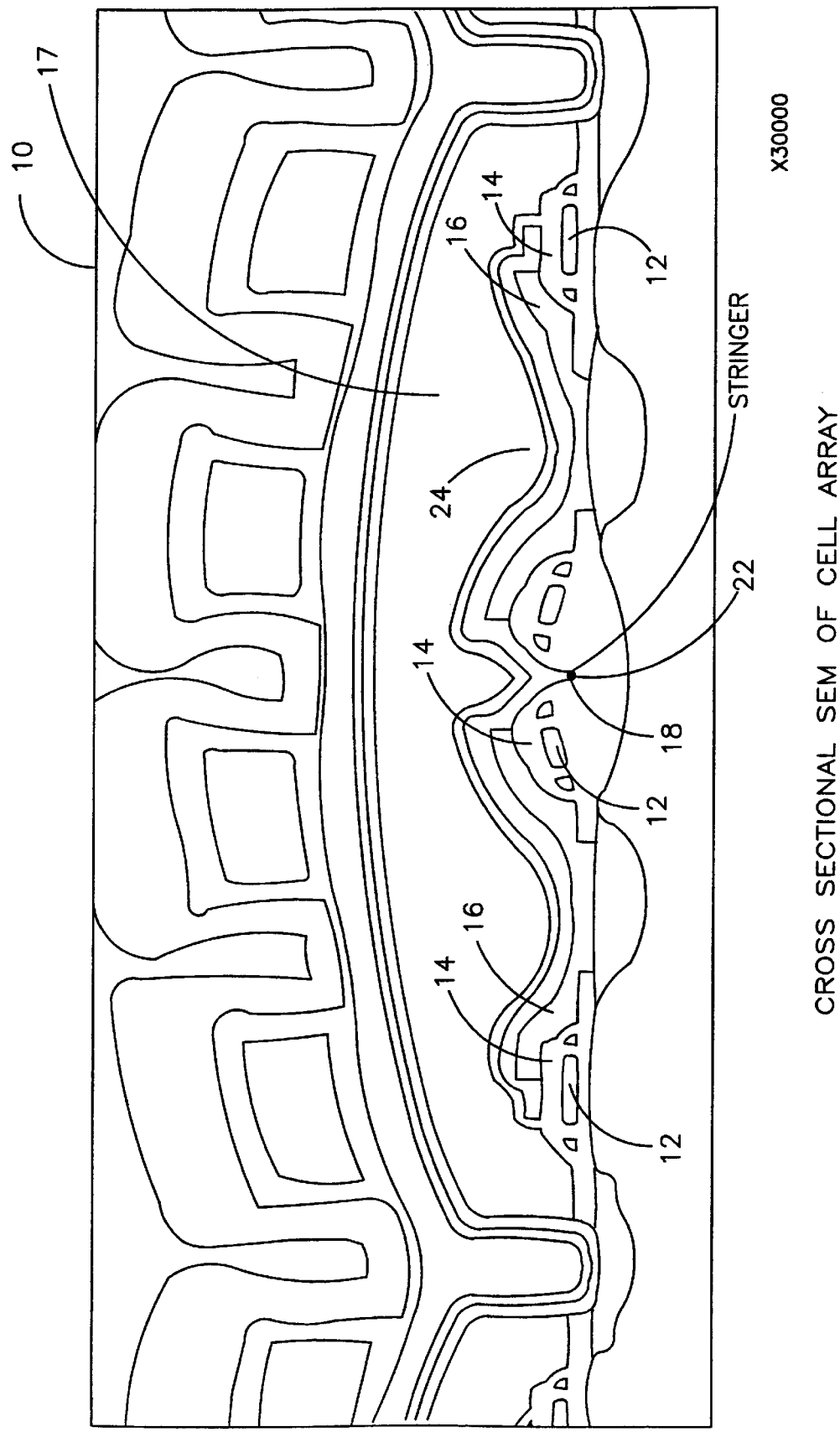
FIG. 1 is a simplified cross-sectional view of conventional DRAM device interconnect layers.

FIG. 1 is a cross-sectional view of a conventional DRAM device 10. The conventional DRAM device includes a first polysilicon layer 12 (or gate electrode layer), an inter-layer dielectric 14 (an insulating layer), and a second polysilicon layer 16, often termed as a bottom capacitor plate. The convention DRAM device uses a low pressure chemical vapor deposition (LPCVD) technique such as a low pressure tetra ethoxy silane (LP-TEOS) or a low pressure silane (LP-silane) process to deposit the inter-layer dielectric layer 14.

As shown, the convention DRAM device has an extremely complicated topography 17, which is difficult to cover adequately with the conventional inter-layer dielectric. In fact, a stringer 18 can form in an insulating layer 14 between the first polysilicon layer 12 and the second polysilicon layer 16. The stringer may also be at other locations, especially for different types of devices. The stringer 18 (a portion of the second polysilicon layer) forms and remains in a recessed region (or gas gap) in the insulating layer 14. Vapor 22 such as $H_2O$ or $O_2$ gas is often trapped in the recessed region after deposition of the second polysilicon layer 16. In subsequent heat-treatment processes, the vapor expands and presses towards the second polysilicon layer. The vapor causes pressure against the second polysilicon layer. This tends to cause failure of the second polysilicon layer, thereby affecting its reliability. In the conventional DRAM device, the vapor presses towards the capacitor structure 24.

Figure 2:
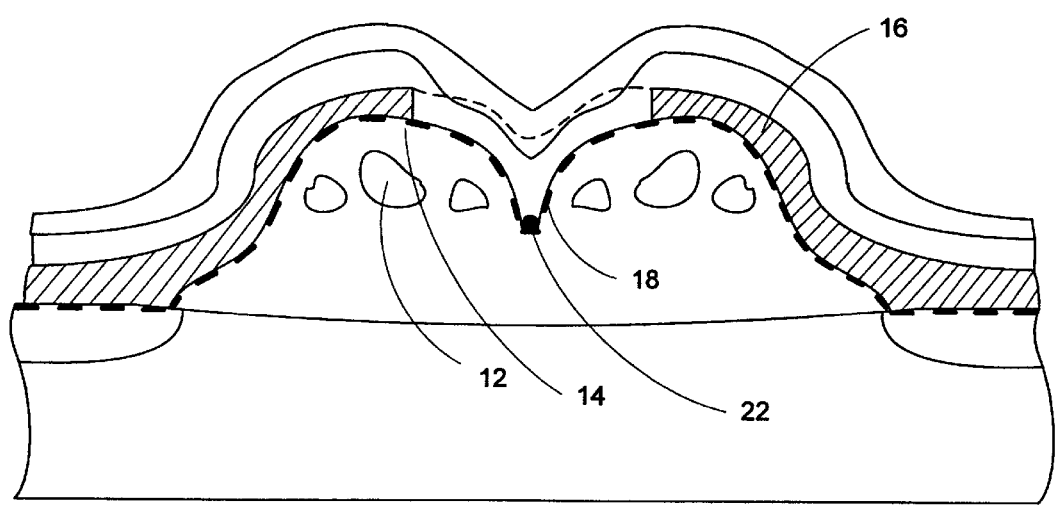
FIG. 2 is a detailed cross-sectional view of the stringer in the conventional DRAM device of FIG. 1.

FIG. 2 illustrates a simplified cross-sectional view of a stringer 18 in the DRAM device of FIG. 1. The stringer is made of polysilicon or a portion of the second polysilicon layer, which remains in a recessed region (or gap) in the insulating layer. The second polysilicon layer portion remains in the recessed region of the insulating layer 14 because the subsequent etching step cannot remove the polysilicon layer portion 18 from its surface, as shown by the thick dashed line. Also shown is the vapor 22. In subsequent heat treatment steps, the vapor expands and presses towards the second polysilicon layer.

The conventional low pressure chemical vapor deposition method relies upon a conventional chemical vapor deposition apparatus. The conventional chemical vapor deposition apparatus often uses deposition pressures of less than 500 millitorr. The low deposition pressure requires sophisticated pumps and chambers, which are often costly and difficult to maintain.

Figure 3:
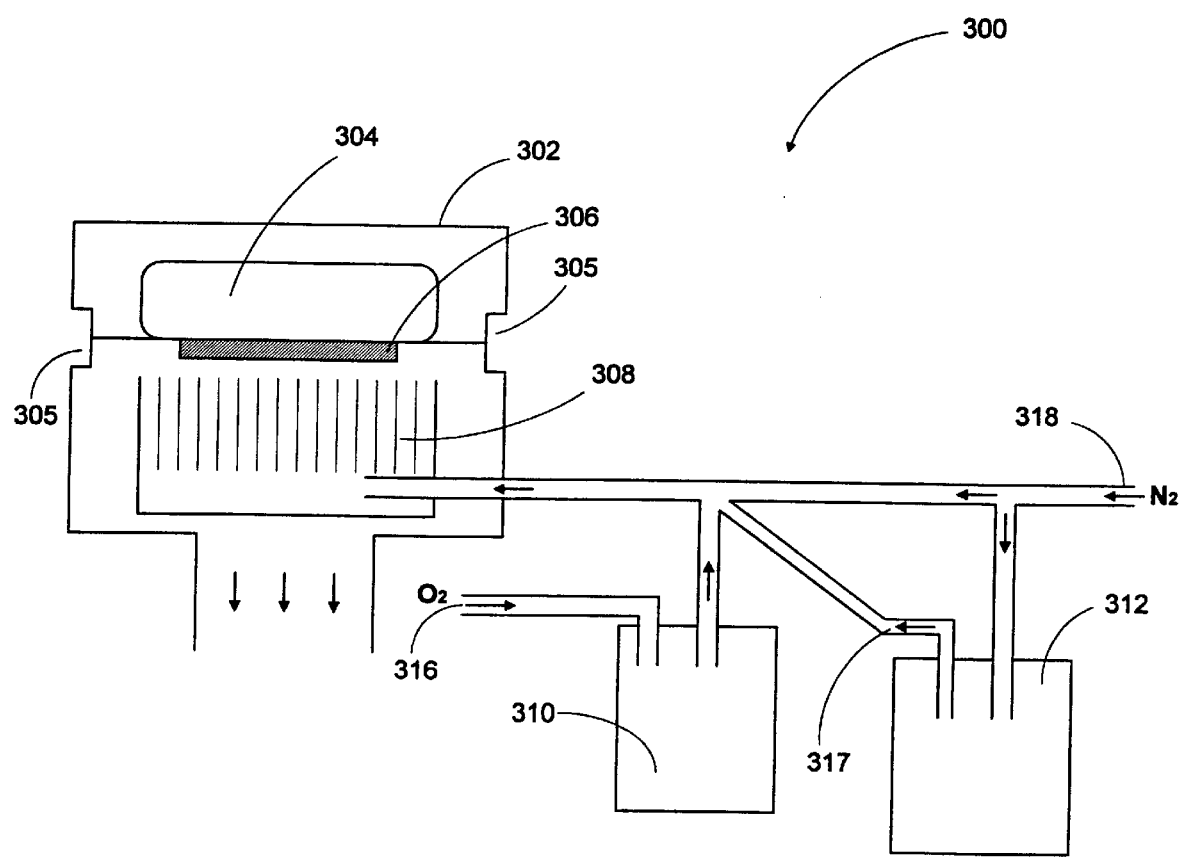
FIG. 3 is a simplified apparatus according to the present invention.

FIG. 3 is a simplified deposition apparatus 300 according to the present invention. The apparatus illustrated is merely an example, and should not be construed as limiting the scope of the claims herein. The apparatus 300 includes a reactor chamber 302, a heater 304, a dispersion head 308, and other elements. A semiconductor wafer 306 is defined in the reactor chamber 302. The heater 304 is attached to the lower platen unit of the reactor 302 to control the temperature of the semiconductor wafer. The dispersion head 308 provides a gas mixture that uniformly contacts the semiconductor wafer 302. Openings 305 to the atmosphere can provide an internal operating pressure in the reaction chamber 302 of about atmospheric pressure, e.g., 1 atm.

In a specific embodiment, the gas mixture includes reactants such as oxygen, ozone, organic silane (e.g., TEOS, HMDS, OMCTS, and others), nitrogen, and other gases. The ozone is generated by an ozone-generator 310 via oxygen introduced into an inlet 316. Taking TEOS for example, liquid TEOS is introduced into a thermostat 312 for vaporization. The vaporized TEOS will be introduced into the dispersion head 308 via line 317. An inert gas such as nitrogen gas is introduced into the dispersion head 308 from inlet 318. The inert gas may behave as a carrier or the like.

According to the present invention, the present method can be briefly outlined as follows.

(1) Provide a partially completed wafer.

(2) Place the partially completed wafer in a reactor chamber.

(3) Define a first polysilicon layer on the partially completed wafer.

(4) Introduce a mixture of ozone gas with a concentration lower than 100 g/m$^3$, and organic silane into the reactor.

(5) Deposit dielectric layer made from the organic silane and ozone mixture overlying a top surface of the partially completed wafer at a pressure of about 1 atmosphere.

(6) Remove the partially completed wafer from the reactor.

(7) Anneal the wafer at a temperature of no less than 800° C.

(8) Define a second polysilicon layer overlying the dielectric layer.

(9) Perform remaining process steps.

As shown above, the ozone gas is introduced into the chamber at a concentration of 100 g/m$^3$ or less with the organic silane. The step occurs at a pressure of about 1 atmosphere. The combination of the ozone gas and the organic silane forms a conformal-like, but not fully conformal, dielectric layer. The conformal-like dielectric layer is defined by an upper surface substantially free from gaps or voids. This dielectric layer tends to prevent the formation of stringers. Details of the present method are described by way of the following Figs. The method illustrated is merely an example, and should not be construed as limiting the scope of the claims herein.

Figure 4:
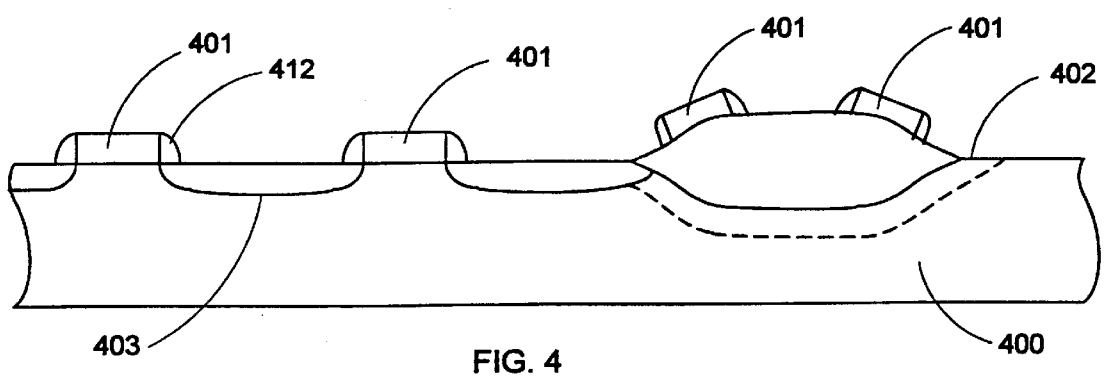
FIGS. 4–6 illustrate a simplified fabrication method according to the present invention.

The present method begins by providing a semiconductor substrate 400, as illustrated by FIG. 4. The semiconductor substrate can be an N-type substrate, a P-type substrate, or any other type of substrate. The substrate also includes partially completed device structures 403 and the like. In the present example, the partially completed device structures are DRAM device structures.

A patterned metal layer 401 is defined overlying a top surface 402 of the substrate. The patterned metal layer 401 can be a polysilicon layer, an aluminum layer, a titanium tungsten layer, or any other type of metal material, and its combinations. The metal layer is often formed by steps of deposition, photolithography, and etching to define an interconnect structure. In the present example, the patterned metal layer is a polysilicon gate layer. The polysilicon gate layer may be formed by any suitable technique such as CVD and the like.

Preferably, the polysilicon layer is doped with impurities. These impurities can be either P-type or N-type. Examples of P-type impurities include boron and others. N-type impurities include arsenic, phosphorous, and the like. Impurities increase the conductivity or reduce the resistivity of the polysilicon layer. Optionally, the polysilicon layer may also be coated with another metal layer such as a silicide or the like. This also reduces resistivity of course, other impurities or metal combinations also can be used depending upon the particular application.

Sidewall spacers 412 are defined on edges of the polysilicon layer 401. Fabrication steps of at least depositing a dielectric layer overlying the polysilicon layer 401, performing an anisotropic etching step on the dielectric layer, and densifying the dielectric layer defines the sidewall spacers. Preferably, the anisotropic etching step uses a plasma or reactive ion etching technique. During the etching step, horizontal portions of the dielectric layer are removed, leaving the sidewall spacers intact. The sidewall spacers can be made of materials such as silicon nitride, silicon dioxide, combinations thereof, and the like.

Figure 5:
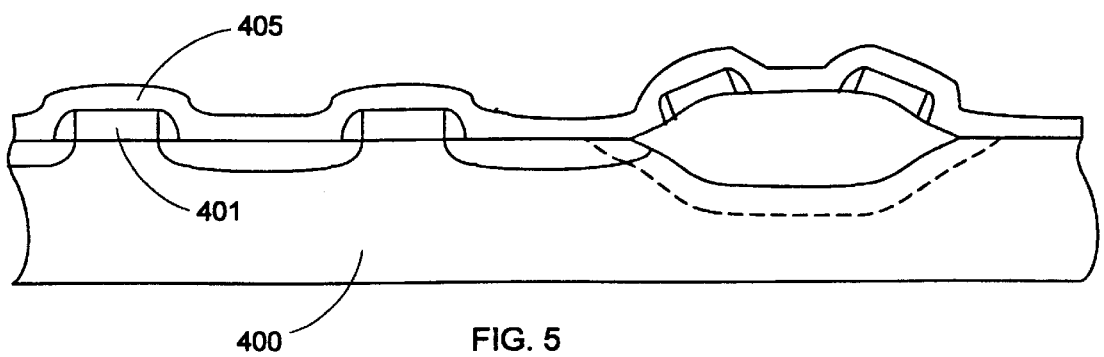

The present method includes a step of placing the substrate into a reactor chamber for deposition of an inter-dielectric layer 405. The inter-dielectric layer is preferably formed by way of deposition of an organic silane-ozone layer and the like. The organic silane-ozone layer is formed by a mixture of ozone gas and an organic silane. A selected combination of ozone gas and organic silane forms a conformal-like, but not fully conformal, dielectric layer, as illustrated by FIG. 5.

The mixture of organic silane and ozone is selective adjusted according to the present invention. The organic silane can be tetra ethyl oxy silane (TEOS), hexa methyl disilane (HMDS), octa methyl cyclo tetrasiloxane (OMCTS), and the like. Ozone includes a concentration of 200 g/m$^3$ and less, or preferably 150 g/m$^3$ and less, or more preferably 100 g/m$^3$ and less, or even more preferably 75 g/m$^3$ and less. A relative flow rate between the ozone and the organic silane such as TEOS ranges from about 2.0:4.0 to about 10.0:1.0, and is preferably about 7.5:2.0. A deposition temperature can be about 300° C. to about 500° C., and is preferably at about 398° C.

The present dielectric layer before annealing includes a shrinkage rate of about 10% to about 3%, and is preferably at about 7%. (Note: shrinkage rate ∝ 1/density) The dielectric layer also is relatively even, that is, the dielectric layer has a uniformity of about 1% to about 3%, and is preferably about 2% or less. An etching rate of about 350 Å/min to about 680 Å/min, and preferably at about 540 Å/min are further included.

After deposition of the dielectric layer, the substrate is removed and annealed. The annealing process densities the dielectric layer to seal the underlying integrated circuit elements. This provides a lower and even etch rate for the dielectric layer material. Densification occurs at a temperature of no less than about 800° C., and is preferably at 850° C. and greater. The temperature of the densification does not substantially affect temperature sensitive semiconductor device elements such as a transistor and others.

The densified dielectric layer has characteristics that prevent moisture accumulation, and provides for more uniform etching. The densified dielectric layer includes a shrinkage rate of about 0%. The densified dielectric layer also includes a moisture content of about 0%. The densified dielectric layer is also relatively even, that is, the densified dielectric layer has a uniformity of 2% to 10%, and is preferably 5% or less. Of course, the selected characteristics of the densified dielectric layer will depend upon the particular application. As shown, the densified dielectric layer is substantially even and does not have a site such as a gap or a recessed region for stringer formation.

Figure 6:
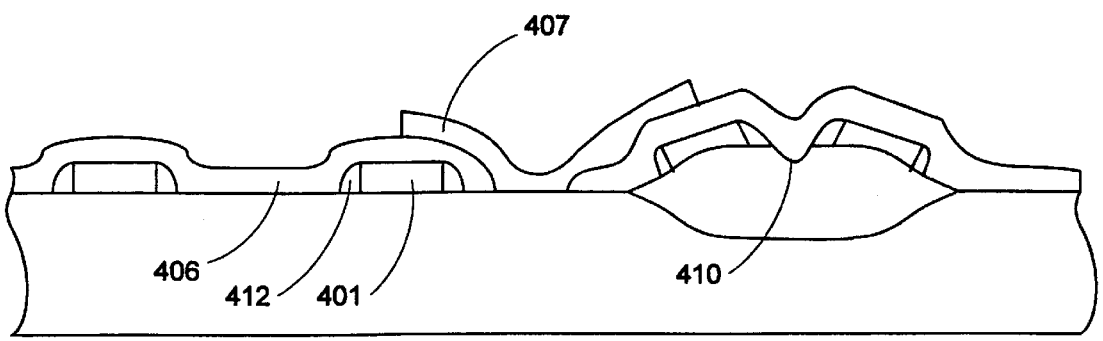

The densified dielectric layer, an organic silane-ozone layer, 406 deposited by APCVD is grown overlying the substrate 400, the polysilicon layer 401, and the sidewalls 412, as illustrated by FIG. 6. This organic silane-ozone dielectric layer 406 after annealing is a high quality oxide, which also seals underlying integrated circuit elements. High quality organic silane-ozone dielectric layer after annealing refers to a substantially pinhole free layer with consistent density. The organic silane-ozone dielectric layer is 1400 Å to about 1800 Å thick, and is preferably 1600 Å thick. This dielectric layer is patterned using an etching process. Examples of such an etching process includes plasma etching, reactive ion etching, and others.

As can be seen, the etching process also provides a relatively smooth surface 410 without gaps between two portions of the polysilicon layer. This smooth surface has been created since the dielectric layer was formed with a relatively even topography and provided an even etch rate. Optionally, a wet etch or dip using hydrofluoric acid may be used to remove any dielectric material such as native oxide before the next process step.

A second polysilicon layer 407 is formed and patterned overlying the dielectric layer. An etching step removing a portion of the second polysilicon layer does not leave a portion of it in the insulating layer, characteristic of the conventional dielectric layer. Remaining processing steps are performed overlying the second polysilicon layer and portions of the dielectric layer.

Experiment

To prove the principle of the present invention, experiments were performed. These experiments should not be construed as limiting the scope of the present invention as described by the claims herein. One of ordinary skill in the art would recognize other applications of the present invention, and also recognize that the experiments described are merely examples.

In an experiment, a partially completed wafer was placed into a deposition reactor according to the present invention. The partially completed wafer was heated from its backside using a heater element. At steady state, the wafer had a relatively constant temperature of about 398° C. Under a pressure of about 1 atmosphere, ozone and TEOS were introduced into the reactor chamber. An ozone and $O_2$ gas mixture ($O_2/O_2+O_3=98\%$) flow rate was about 7.5 standard. liters per minute and the TEOS flow rate was about 2.0 standard liters per minute. The ozone concentration was held in the reactor at about 25±5 grams/meter$^3$ for about 70 to 75 seconds. This provided an insulating layer of about 1600 Å overlying the partially completed wafer. The partially completed wafer with the insulating layer underwent annealing at a temperature of about 850° C. for about 30 minutes.

In the experiment, the present invention had substantial advantages over the conventional techniques. For example, the insulating layer was deposited using a low concentration ozone. The low concentration of ozone had a deposition rate that was not substantially sensitive to the type of material underlying the insulating layer. Accordingly, the insulating layer was substantially consistent, even though portions of it was applied over different types of materials. This makes the present invention compatible with complicated topography using different types of materials, which was often harmful to later etching processes or the like.

Other advantages of the invention were confirmed by the experiments. In particular, the invention also prevented short circuits between the first and second polysilicon layers. The invention prevented leakage current from passing between the first and the second polysilicon layers. The insulating layer did not have undesired features such as a high water-absorbability, a high etching rate, a high shrinkage rate, and other disadvantages. The annealing step densified the insulating layer and removed water contained therein. This reduces a subsequent etching rate as shown in Table 1.

TABLE 1

Deposition with Ozone Concentration of 25 g/m$^3$.

| SAMPLES | ETCHING RATE (Å/Min) |
|---|---|
| SAMPLE WITH ANNEAL | 204 |
| SAMPLE WITHOUT ANNEAL | 668 |

From Table 1, it was observed that the etching rate of present insulating layer with annealing is relative low, as compared to the conventional insulation layer without an anneal. The lower etching rate preserved the present insulation layer during several wet etching steps (e.g., HF etching) to keep the first polysilicon layer isolated from the second polysilicon layer.

The present invention further provides higher device yields, especially for devices having design rules of 0.5 microns and less. As noted above, the conventional LPCVD deposition of the conventional insulating layer is often very or fully conformal, thereby generating the stringer which occurs after formation of the second polysilicon layer. The stringer is harmful for the conventional capacitor structure and results in lower device yields.

The invention uses APCVD with low ozone concentrations to deposit the insulation layer which is conformal-like, but not fully conformal, and thus substantially eliminates recessed regions forming under the stringer. By way of the present insulation layer, device yields on a semiconductor wafer are often higher, thereby decreasing the average cost of an integrated circuit and the like.

While the above is a full description of the specific embodiments, various modifications, alternative constructions and equivalents may be used. For example, while the description above is in terms of an insulation layer structure between polysilicon layers in a DRAM integrated circuit device, it would be possible to implement the present invention with other types of integrated circuits and interconnect materials the like.

Therefore, the above description and illustrations should not be taken as limiting the scope of the present invention which is defined by the appended claims.

What is claimed is:

1. A method of fabricating an integrated circuit device, said method comprising steps of:

providing a partially completed semiconductor device, said partially completed semiconductor device having a first polysilicon layer thereon;

forming a dielectric layer overlying said first polysilicon layer and portions of said partially completed semiconductor device at a pressure of about 1 atmosphere;

forming a second polysilicon layer overlying portions of said dielectric layer; and patterning said second polysilicon region, said patterning step providing an upper surface portion of said dielectric layer that is substantially free from stringers;

wherein said dielectric layer forming step comprises reacting an organic silane and an oxygen and ozone mixture, said oxygen and ozone mixture and said organic silane at a relative mass flow rate ranging from about 2.0:4.0 to about 10.0:1.0.

2. The method of claim 1 wherein said organic silane is selected from a group consisting of a tetra ethoxy silane (TEOS), a hexa methyl disilane (HMDS), and an octa methyl cyclo tetrasiloxane (OMCTS).

3. The method of claim 1 wherein said ozone has a concentration of about 150 g/m$^3$ and less.

4. The method of claim 1 wherein said ozone has a concentration of about 100 g/m$^3$ and less.

5. The method of claim 2 wherein said oxygen and ozone mixture and said organic silane are at a relative mass flow rate of about 7.5:2.0.

6. The method of claim 1 wherein said dielectric layer forming step is at a temperature of about 300° to about 500° C.

7. The method of claim 1 wherein said dielectric layer forming step is at a temperature of about 398° C.

8. The method of claim 1 further comprising a step of annealing said partially completed device at a temperature of no less than about 800° C.

9. The method of claim 1 further comprising a step of annealing said partially completed device at a temperature of no less than about 850° C.

10. The method of claim 1 wherein said ozone has a concentration at about 200 g/m$^3$ and less.

11. A method of forming a dielectric layer, said method comprising:

combining an organic silane and an oxygen and ozone mixture at a pressure of about 1 atm; and forming an insulating layer from said ozone and said organic silane mixture;

wherein said insulating layer forming step comprises reacting said organic silane and said oxygen and ozone mixture, said oxygen and ozone mixture and said organic silane being at a relative mass flow rate ranging from about 2.0:4.0 to about 10.0:1.0.

12. The method of claim 11 wherein said organic silane is selected from a group consisting of a tetra ethoxy silane (TEOS), a hexa methyl disilane (HMDS), and an octa methyl cyclo tetrasiloxane (OMCTS).

13. The method of claim 11 wherein said ozone has a concentration of about 150 g/m$^3$ and less.

14. The method of claim 11 wherein said ozone has a concentration of about 100 g/m$^3$ and less.

15. The method of claim 12 wherein said oxygen and ozone mixture and said organic silane are at a relative mass flow rate of about 7.5:2.0.

16. The method of claim 11 wherein said insulating layer forming step is at a temperature of about 300° to about 500° C.

17. The method of claim 11 wherein said insulating layer forming step is at a temperature of about 398° C.

18. The method of claim 11 further comprising a step of annealing said substrate at a temperature of no less than about 800° C.

19. The method of claim 11 further comprising a step of annealing said substrate at a temperature of no less than about 850° C. and greater.

20. The method of claim 11 wherein said ozone has a concentration of about 200 g/m$^3$ and less.

21. A method of forming an integrated circuit device, said method comprising:

providing a partially completed device comprising a plurality of regions, said plurality of regions comprising a first polysilicon region and a field isolation oxide region;

introducing a mixture comprising an organic silane and an oxygen and ozone mixture at a pressure of about 1 atmosphere; and forming a dielectric layer from said mixture overlying said plurality of regions;

wherein said dielectric layer forming step comprises reacting said organic silane and said oxygen and ozone mixture, said oxygen and ozone mixture and said organic silane being at a relative mass flow rate ranging from about 2.0:4.0 to about 10.0:1.0.

22. The method of claim 21 wherein said plurality of regions comprises a sidewall spacer region.

23. The method of claim 21 further comprising steps of annealing and etching said dielectric layer.

24. The method of claim 23 further comprising a step of forming a second polysilicon region overlying portions of said polysilicon layer and said field isolation oxide layer.

25. The method of claim 24 further comprising a step of patterning said second polysilicon region, said patterning step providing an upper surface substantially free from a stringer.

* * * * *

UNITED STATES PATENT AND TRADEMARK OFFICE
CERTIFICATE OF CORRECTION

PATENT NO.    : 5,869,406
DATED         : February 9, 1999
INVENTOR(S)   : Wen-Doe Su, Chia-Lin Ku It is certified that error appears in the above-identified patent and that said Letters Patent is hereby corrected as shown below:

Title page,
Item [75], Inventors: Wen-Doe Su, Chu-Tung; Chia-Lin Ku, Chu-Pei, both of [China] Taiwan, Republic of China Item [73], Assignee: Mosel Vitelic, Inc., [China] Taiwan, Republic of China Signed and Sealed this Sixth Day of November, 2001

*Attest:*

*Nicholas P. Godici*

NICHOLAS P. GODICI
*Attesting Officer*   *Acting Director of the United States Patent and Trademark Office*